United States Patent
Cheng et al.

(10) Patent No.: US 9,209,316 B2
(45) Date of Patent: Dec. 8, 2015

(54) ROM FOR CONSTRAINING $2^{nd}$-BIT EFFECT

(75) Inventors: Chih-Chieh Cheng, Hsinchu (TW);
Cheng-Hsien Cheng, Hsinchu (TW);
Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 75 days.

(21) Appl. No.: 13/421,389

(22) Filed: Mar. 15, 2012

(65) Prior Publication Data
US 2013/0240975 A1    Sep. 19, 2013

(51) Int. Cl.
| H01L 27/115 | (2006.01) |
|---|---|
| H01L 29/792 | (2006.01) |
| G11C 11/56 | (2006.01) |
| G11C 16/04 | (2006.01) |

(52) U.S. Cl.
CPC .......... *H01L 29/792* (2013.01); *G11C 11/5621* (2013.01); *G11C 16/0466* (2013.01); *H01L 27/11521* (2013.01); *H01L 27/11568* (2013.01)

(58) Field of Classification Search
CPC .................... H01L 27/11521; H01L 27/11568
USPC ........................................................ 257/324
See application file for complete search history.

(56) References Cited

U.S. PATENT DOCUMENTS

| 6,724,032 | B2 | 4/2004 | Chindalore et al. | |
|---|---|---|---|---|
| 7,968,921 | B2 * | 6/2011 | Bulucea et al. | 257/288 |
| 8,330,232 | B2 * | 12/2012 | Ku et al. | 257/402 |
| 2004/0016950 | A1 | 1/2004 | Chindalore et al. | |
| 2007/0040211 | A1 | 2/2007 | Ku et al. | |
| 2012/0018790 | A1 * | 1/2012 | Yan et al. | 257/315 |

FOREIGN PATENT DOCUMENTS

| CN | 101083286 | 12/2007 |
|---|---|---|
| CN | 101087003 | 12/2007 |
| TW | 200805661 | 1/2008 |
| TW | 200814240 | 3/2008 |

OTHER PUBLICATIONS

"Office Action of Taiwan Counterpart Application", issued on Feb. 13, 2014, p. 1-p. 5.
"Office Action of Chinese Counterpart Application", issued on Apr. 8, 2015, p. 1-p. 7.

* cited by examiner

*Primary Examiner* — Evan Pert
(74) *Attorney, Agent, or Firm* — J.C. Patents

(57) ABSTRACT

A read only memory including a substrate, a source region and a drain region, a charge storage structure, a gate, and a local extreme doping region is provided. The source region and the drain region are disposed in the substrate, the charge storage structure is located on the substrate between the source region and the drain region, and the gate is configured on the charge storage structure. The local extreme doping region is located in the substrate between the source region and the drain region and includes a low doping concentration region and at least one high doping concentration region. The high doping concentration region is disposed between the low doping concentration region and one of the source region and the drain region, and a doping concentration of the high doping concentration region is three times or more than three times a doping concentration of the low doping concentration region.

18 Claims, 16 Drawing Sheets

ROM FOR CONSTRAINING $2^{nd}$-BIT EFFECT

BACKGROUND OF THE INVENTION

1. Technical Field

The disclosure relates to a read only memory (ROM); more particularly, the disclosure relates to an ROM constraining a $2^{nd}$-bit effect.

2. Related Art

An ROM having the charge storage structure for data storage is a common non-volatile memory at present. The structure of the ROM includes a gate insulation layer (e.g., an oxide-nitride-oxide (ONO) layer) capable of storing and even trapping charges. If charges are stored by a localized charge trapping structure, two separated charge bits are allowed to exist in each memory cell, so as to form a 2 bits in one cell (2 bits/cell) memory.

In order to read separated charges at two sides of one 2 bits/cell memory, a reverse read operation is performed. During the reverse read operation, a read bias is applied to a source terminal to sense charges at a drain side junction and thereby complete the read operation, and vice versa. If charges exist at a source side junction, the read bias need be high enough to lessen the influence of the charges at the source side junction.

However, during operation of the 2 bits/cell memory, the 2 bits in one cell may still interact, thus leading to relevant problems. Hence, given that one bit has been stored at one side of the memory cell, a $2^{nd}$-bit effect occurs when the other side of the memory cell is being read, i.e., a voltage in the portion where a high current is expected may drop. Namely, when the memory cell is being read, the existing bit poses a direct impact on the memory cell, thus increasing a barrier and a threshold voltage (Vt) for reading. Under said circumstances, a read error is likely to occur.

The $2^{nd}$-bit effect not only implicates the operation of devices but also deteriorates the device reliability. Moreover, the $2^{nd}$-bit effect reduces a sense margin and a Vt window for operating the left bit and the right bit, thus giving rise to operation difficulties of a multi-level memory.

SUMMARY OF THE INVENTION

The disclosure provides an ROM capable of mitigating a $2^{nd}$-bit effect.

In the disclosure, an ROM that includes a substrate, a source region and a drain region, a charge storage structure, a gate, and a local extreme doping region is provided. The source region and the drain region are disposed in the substrate, the charge storage structure is located on the substrate between the source region and the drain region, and the gate is configured on the charge storage structure. The local extreme doping region is located in the substrate between the source region and the drain region and includes a low doping concentration region and at least one high doping concentration region. The high doping concentration region is disposed between the low doping concentration region and one of the source region and the drain region, and a doping concentration of the high doping concentration region is three times or more than three times a doping concentration of the low doping concentration region.

According to an embodiment of the disclosure, a conductive type of the high doping concentration region is the same as a conductive type of the low doping concentration region.

According to an embodiment of the disclosure, the doping concentration of the high doping concentration region is from three times to twenty times the doping concentration of the low doping concentration region.

According to an embodiment of the disclosure, the doping concentration of the high doping concentration region is from three times to ten times the doping concentration of the low doping concentration region.

According to an embodiment of the disclosure, a doping concentration of the substrate is three times to ten times the doping concentration of the low doping concentration region.

According to an embodiment of the disclosure, a doping concentration of the substrate is equal to or approximate to the doping concentration of the at least one high doping concentration region.

According to an embodiment of the disclosure, the high doping concentration region includes two doping regions respectively located between the source region and the low doping concentration region and between the drain region and the low doping concentration region.

According to an embodiment of the disclosure, the two doping regions are symmetrically configured at two sides of the low doping concentration region.

According to an embodiment of the disclosure, a thickness of the low doping concentration region ranges from about 50 Å to about 500 Å.

According to an embodiment of the disclosure, a thickness of the low doping concentration region ranges from about 50 Å to about 150 Å.

According to an embodiment of the disclosure, the low doping concentration region is in direct contact with the charge storage structure.

According to an embodiment of the disclosure, the charge storage structure includes an ONO layer.

According to an embodiment of the disclosure, the high doping concentration region has a narrow top portion and a wide bottom portion, for instance.

According to an embodiment of the disclosure, the charge storage structure has at least one charge storage region, and an edge of the charge storage region is aligned with the edge of the drain region.

According to an embodiment of the disclosure, a distance between an edge of the low doping concentration region and the source region or the drain region is smaller than 150 Å.

According to an embodiment of the disclosure, the charge storage structure has at least one charge storage region, and the at least one high doping concentration region is one doping region.

According to an embodiment of the disclosure, the one doping region is asymmetrically configured at one side of the low doping concentration region, and the one doping region and the charge storage region are at different sides.

Based on the above, the local extreme doping region is configured in the channel region of the ROM; hence, through the channel with the large doping concentration difference, the $2^{nd}$-bit effect on the device operation can be mitigated.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
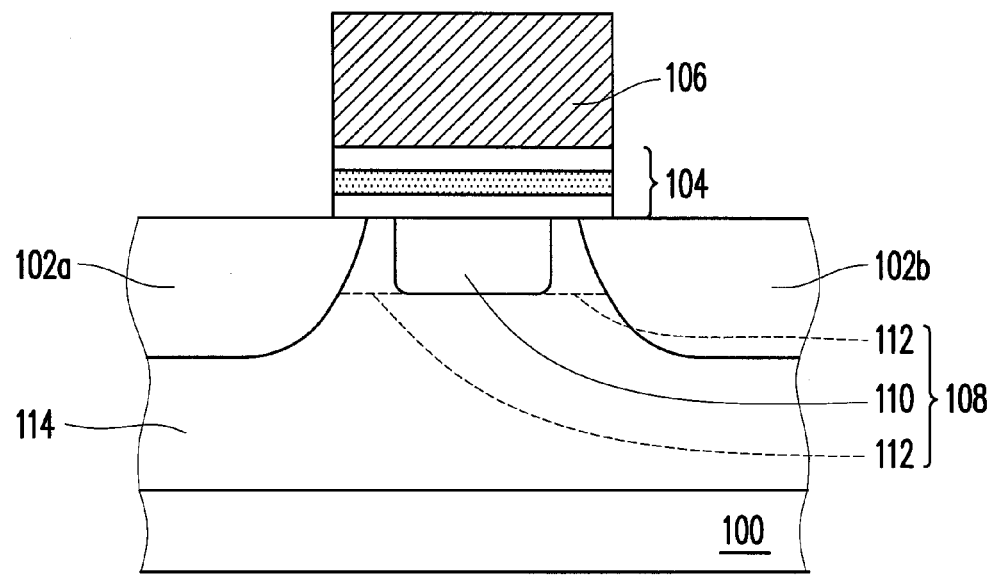
FIG. 1 is a schematic view illustrating an ROM according to a first embodiment of the disclosure.

FIG. 1 is a schematic view illustrating an ROM according to a first embodiment of the disclosure.

In FIG. 1, the ROM includes a substrate 100, a source region 102a and a drain region 102b, a charge storage structure 104, a gate 106, and a local extreme doping region 108. According to the disclosure, the local extreme doping region refers to a region constituted by a plurality of doping regions whose doping concentrations differ from one another. For instance, the doping concentration of one of the doping regions may be three times or more than three times the doping concentration of another of the doping regions. The local extreme doping region 108 is located in the substrate 100 between the source region 102a and the drain region 102b and includes a low doping concentration region 110 and at least one high doping concentration region 112. If the doping concentration of the high doping concentration region 112 is three times or more than three times the doping concentration of the low doping concentration region 110, the $2^{nd}$-bit effect will be reduced to 0.66 times that when only the low doping concentration region 110 between the source region 102a and the drain region 102b. If the doping concentration of the high doping concentration region 112 is less than three times the doping concentration of the low doping concentration region 110, the reduction of the $2^{nd}$-bit effect is slight. The source region 102a and the drain region 102b are disposed in the substrate 100, the charge storage structure 104 is located on the substrate 100 between the source region 102a and the drain region 102b, and the gate 106 is configured on the charge storage structure 104.

The high doping concentration region 112 may be configured between the source region 102a and the low doping concentration region 110 or between the drain region 102b and the low doping concentration region 110. Alternatively, as shown in FIG. 1, the high doping concentration regions 112 may be respectively configured between the source region 102a and the low doping concentration region 110 and between the drain region 102b and the low doping concentration region 110. A doping concentration of the high doping concentration region 112 need be three times or more than three times a doping concentration of the low doping concentration region 110, e.g., three times to twenty times, preferably three times to ten times. The charge storage structure 104 may be an ONO layer or any other appropriate charge storage layer.

In the present embodiment, the high doping concentration region 110 has a narrow top portion and a wide bottom portion, and the high doping concentration region 112 and the low doping concentration region 110 have the same conductive type, e.g., both the high doping concentration region 112 and the low doping concentration region 110 are the p-type, and the source region 102a and the drain region 102b are the n-type. The substrate 100 normally has a well region 114 therein, and a doping concentration of the well region 114 (i.e., the doping concentration of the substrate 100) is three times to ten times the doping concentration of the low doping concentration region 110. Namely, the doping concentration of the substrate 100 may be equal to or approximate to the doping concentration of the high doping concentration region 112.

Several simulation experiments are provided below.

Simulation Experiment 1

Figure 2:
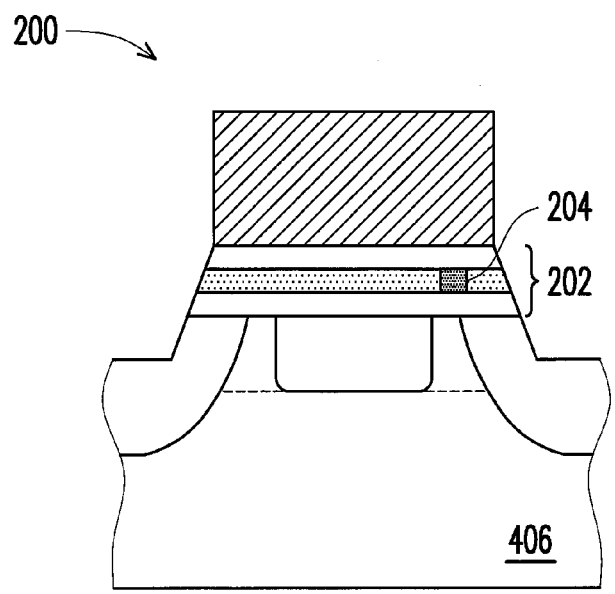
FIG. 2 is a schematic view illustrating an ROM according to a simulation experiment 1.
Figure 3A:
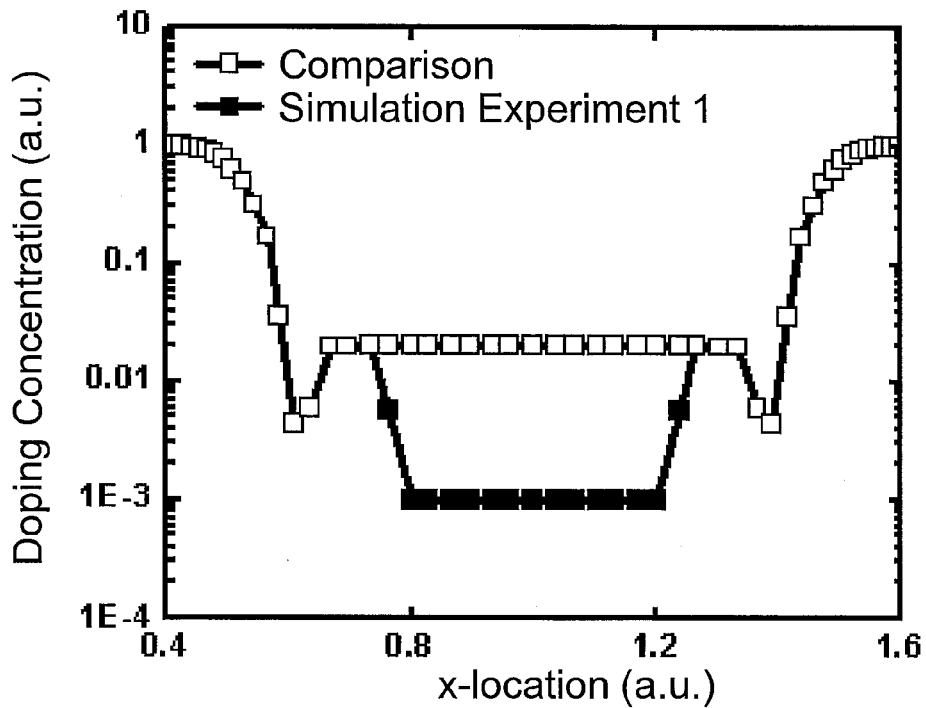
FIG. 3A illustrates variations in doping concentrations of a source region, a channel, and a drain region of the ROM according to the simulation experiment 1.

The simulation objects are an ROM (shown in FIG. 2) with the local extreme doping region and a conventional ROM without the local extreme doping region (comparison example), and variations in doping concentrations of a source region, a channel, and a drain region of the ROM and the conventional ROM are shown in FIG. 3A. In the ROM 200 depicted in FIG. 2, charges are already introduced to the location 204 at the right-handed portion of the ONO layer 202. According to the simulation experiment 1, when the other side of the ONO layer 202 is being read, the variation in $2^{nd}$-bit effect on the ROM with or without the local extreme doping region is evaluated, and the evaluated result is shown in FIG. 3B.

Figure 3B:
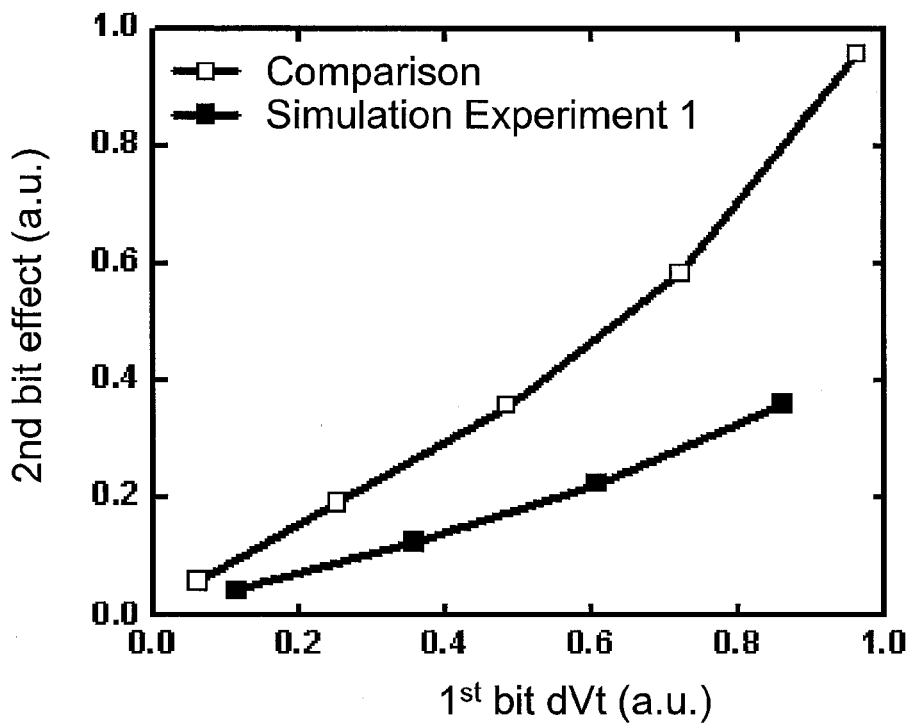
FIG. 3B shows changes to a $2^{nd}$-bit effect according to the simulation experiment 1.

It can be observed from FIG. 3B that the ROM with the local extreme doping region is capable of mitigating the $2^{nd}$-bit effect to a great extent.

Simulation Experiment 2

Figure 4:
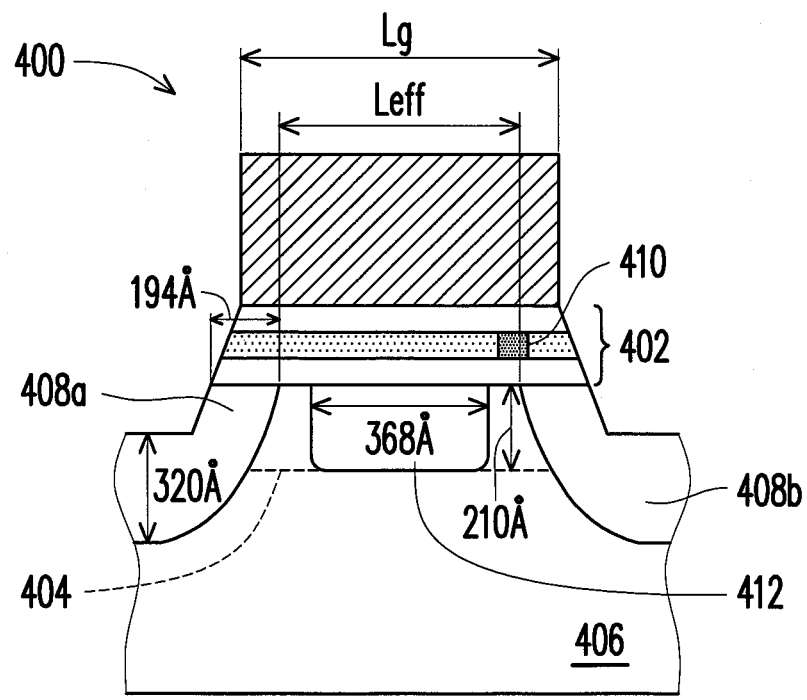
FIG. 4 is a schematic view illustrating an ROM according to a simulation experiment 2.

The simulation object is an ROM 400 with the local extreme doping region, as depicted in FIG. 4, and the fixed parameters are:

$L_g=0.08$ μm; $L_{eff}=0.057$ μm; a doping concentration of the high doping concentration region 404=a doping concentration of the substrate 406=2e18 cm$^{-3}$; doping concentrations of the source region 408a and the drain region 408b=1e20 cm$^{-3}$; a width of a charge storage region 410 is 50 Å; the right edge of the charge storage region 410 is aligned with the left edge of the drain region 408b.

Figure 5A:
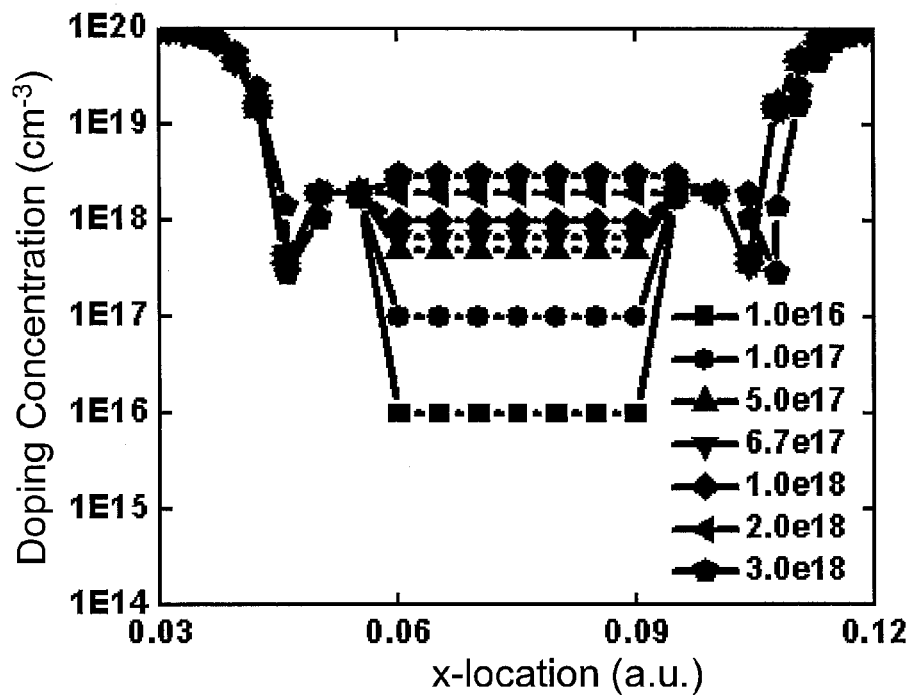
FIG. 5A illustrates variations in a doping concentration of a low doping concentration region in a local extreme doping region of the ROM according to the simulation experiment 2.

The variable is the doping concentration of the low doping concentration region 412 in the local extreme doping region. As shown in FIG. 5A, the doping concentration ranges from 3.0e18 cm$^{-3}$ (higher than the doping concentration of the high doping concentration region 404) to 1.0e16 cm$^{-3}$ (lower than the doping concentration of the high doping concentration region 404).

Figure 5B:
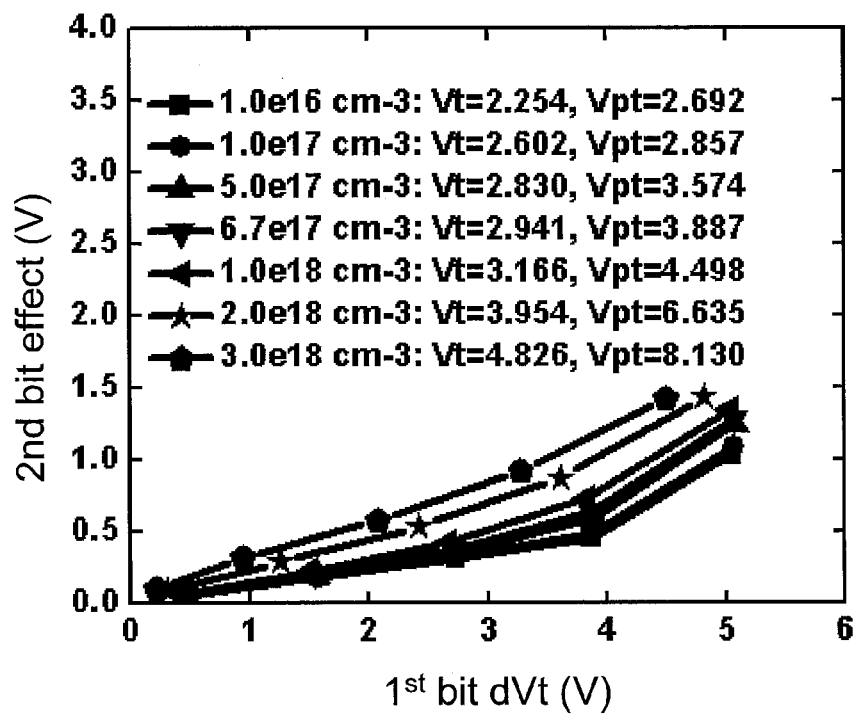
FIG. 5B shows changes to a $2^{nd}$-bit effect according to the simulation experiment 2.

The simulation results are shown in following Table 1 and FIG. 5B.

TABLE 1

|  | Doping concentration (cm$^{-3}$) | 2$^{nd}$ bit effect (V) | 2$^{nd}$ bit effect/ 1.05 |
|---|---|---|---|
| Region 404 | 2.0e18 |  |  |
| Region 412 | 3.0e18 | 1.22 | 1.161904762 |
|  | 2.0e18 | 1.05 | 1 |
|  | 1.0e18 | 0.81 | 0.771428571 |
|  | 6.7e17 | 0.7 | 0.666666667 |
|  | 5.0e17 | 0.65 | 0.619047619 |
|  | 1.0e17 | 0.54 | 0.514285714 |
|  | 1.0e16 | 0.52 | 0.495238095 |

It is shown in Table 1 that as long as the doping concentration of the high doping concentration region 404 is three times the doping concentration of the low doping concentration region 412, the 2$^{nd}$-bit effect is only 0.66 times that when identical doping concentration (i.e. the low doping concentration region 110) is between the source region 102a and the drain region 102b. If the doping concentration of the high doping concentration region 404 is less than three times the doping concentration of the low doping concentration region 412, the mitigation of the 2$^{nd}$-bit effect may be unobvious even through the 2$^{nd}$-bit effect will be reduced.

FIG. 5B also shows the same simulation results. When the doping concentration of the high doping concentration region 404 is ten times or more than ten times the doping concentration of the low doping concentration region 412, the change to the 2$^{nd}$-bit effect gradually becomes insignificant. Therefore, even though the difference between the doping concentration of the high doping concentration region 404 and the doping concentration of the low doping concentration region 412 becomes more and more evident, the mitigation of the 2$^{nd}$-bit effect on the memory tends to remain constant.

Simulation Experiment 3

The simulation object is basically the same as the ROM 400 depicted in FIG. 4, and the fixed parameters are:

$L_g=0.08$ μm; $L_{eff}=0.057$ μm; a doping concentration of the low doping concentration region is fixed to 1e17 cm$^{-3}$; doping concentrations of the source region and the drain region=1e20 cm$^{-3}$; a width of a charge storage region 410 is 50 Å; the right edge of the charge storage region 410 is aligned with the left edge of the drain region 408b.

Figure 6:
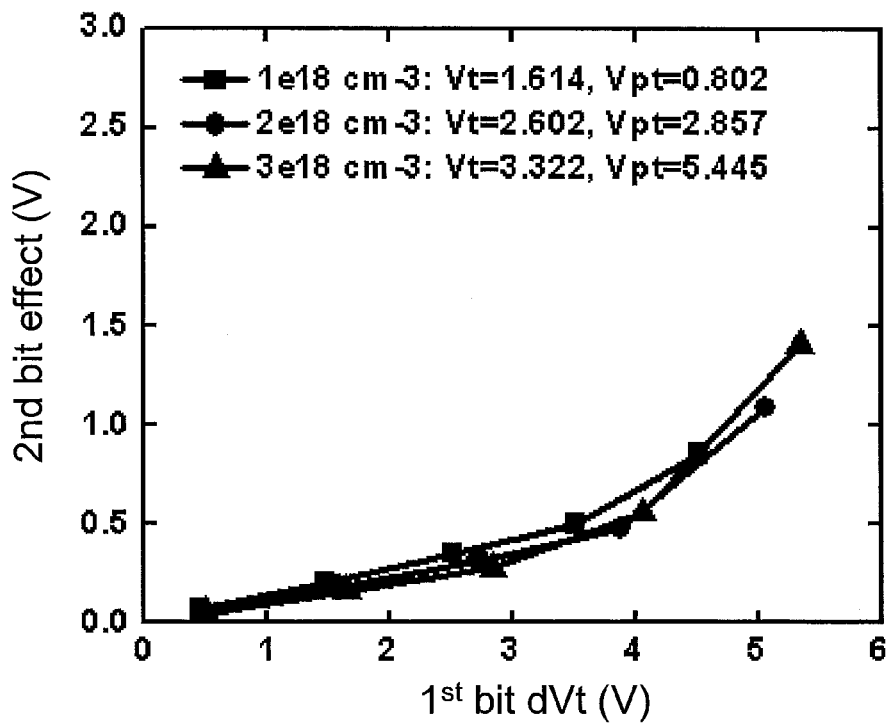
FIG. 6 shows changes to a $2^{nd}$-bit effect according to a simulation experiment 3.

The variable is the doping concentration of the substrate and the doping concentration of the high doping concentration region in the local extreme doping region, and the doping concentrations of 1e18 cm$^{-3}$, 2e18 cm$^{-3}$, and 3e18 cm$^{-3}$ are respectively simulated and shown in FIG. 6. The variations in the doping concentration of the high doping concentration region do not pose a significant impact on mitigation of the 2$^{nd}$-bit effect on the memory. However, low doping concentration may affect a punch-through voltage $V_{pt}$.

Simulation Experiment 4

The simulation object is basically the same as the ROM 400 depicted in FIG. 4, and the fixed parameters are:

$L_g=0.08$ μm; $L_{eff}=0.057$ μm; a doping concentration of the low doping concentration region is fixed to 1e17 cm$^{-3}$; doping concentrations of the source region and the drain region=1e20 cm$^{-3}$; a width of a charge storage region 410 is 50 Å; the right edge of the charge storage region 410 is aligned with the left edge of the drain region 408b; a doping concentration of the high doping concentration region in the extreme packet channel is ten times a doping concentration of the low doping concentration region.

The variable is the doping concentrations of the high doping concentration region and the low doping concentration region. The doping concentrations of the high doping concentration region are simulated as 1e18 cm$^{-3}$, 2e18 cm$^{-3}$, and 3e18 cm$^{-3}$ and are shown in FIG. 7.

Figure 7:
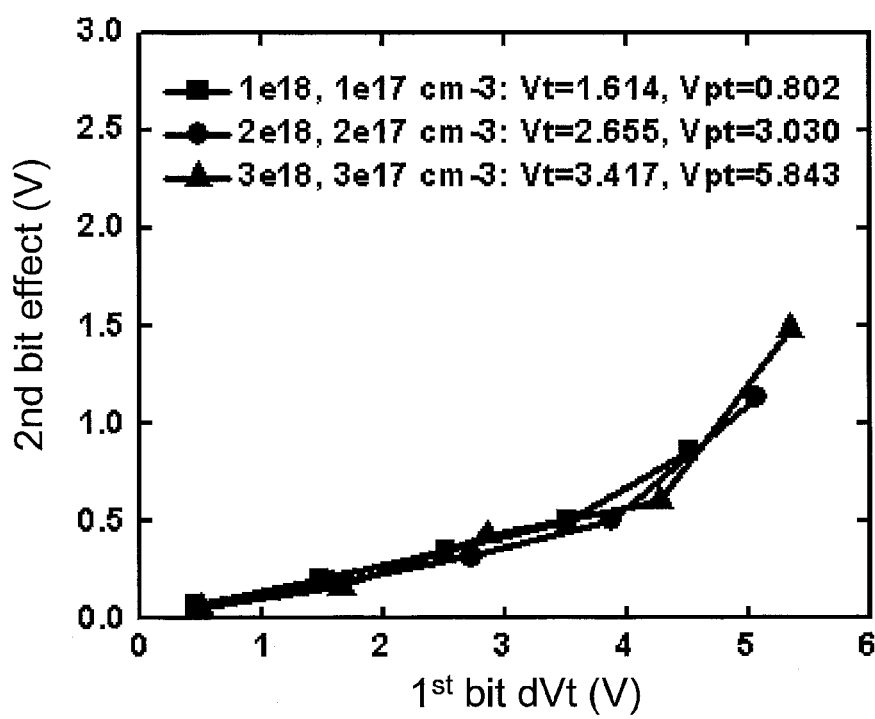
FIG. 7 shows changes to a $2^{nd}$-bit effect according to a simulation experiment 4.

It can be learned from FIG. 7 that the similar result can be obtained once a rate of the doping concentration of the high doping concentration region to the doping concentration of the low doping concentration region is maintained.

Simulation Experiment 5

The simulation object is basically the same as the ROM 400 depicted in FIG. 4, and the fixed parameters are:

$L_g=0.08$ μm; $L_{eff}=0.057$ μm; a doping concentration of the low doping concentration region is 1e17 cm$^{-3}$; doping concentrations of the high doping concentration region and the substrate are 2e18 cm$^{-3}$; doping concentrations of the source region and the drain region=1e20 cm$^{-3}$; a width of a charge storage region 410 is 50 Å; the right edge of the charge storage region 410 is aligned with the left edge of the drain region 408b.

Figure 8A:
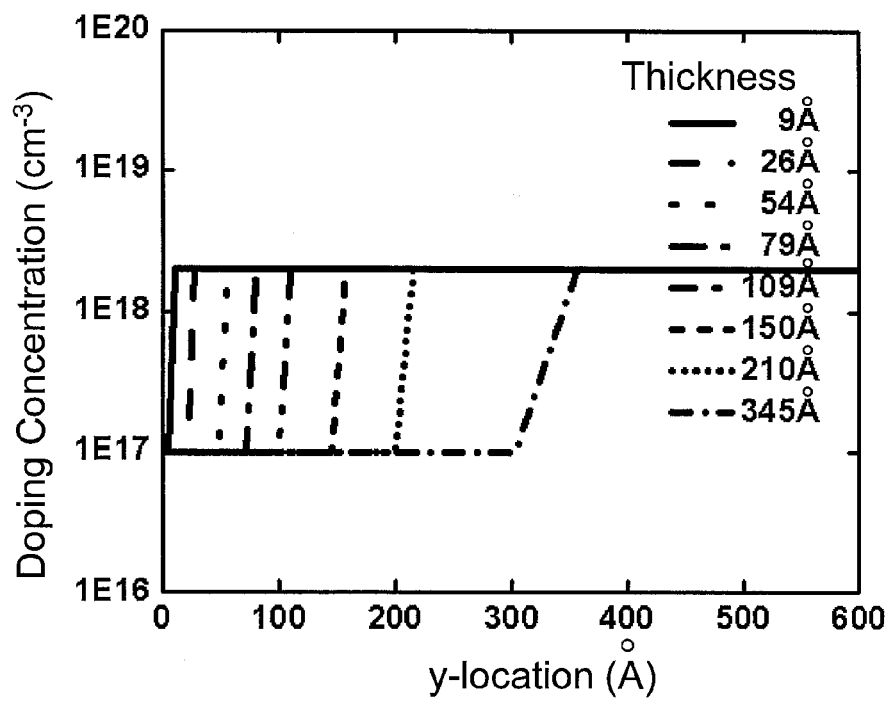
FIG. 8A illustrates variations in a thickness of a low doping concentration region in a local extreme doping region of an ROM according to a simulation experiment 5.
Figure 8B:
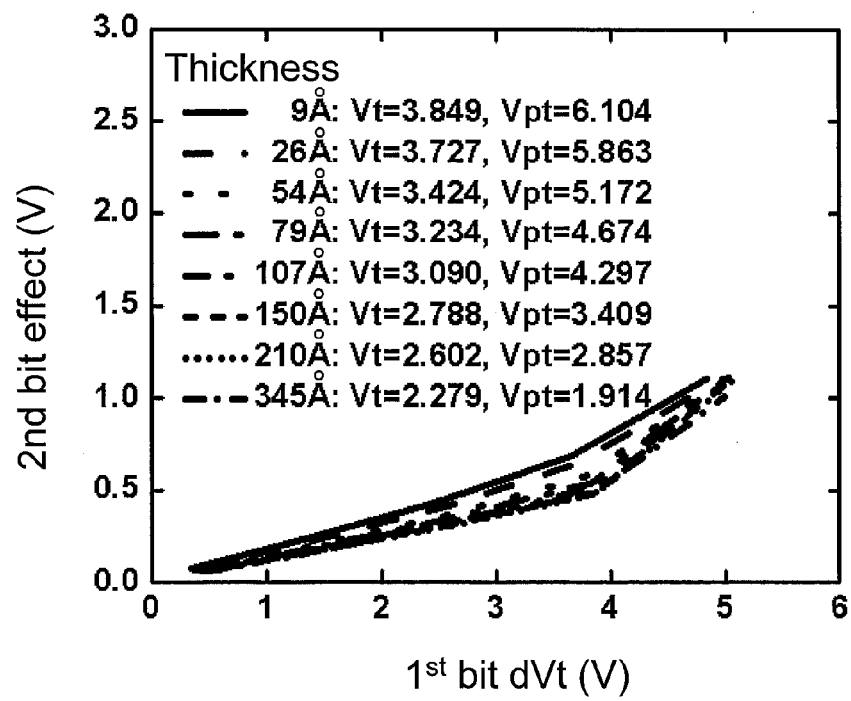
FIG. 8B shows changes to a $2^{nd}$-bit effect according to the simulation experiment 5.

The variable is a thickness of the low doping concentration region. As shown in FIG. 8A, the thickness of the low doping concentration region varies from about 9 Å to about 345 Å, and the simulation results are shown in FIG. 8B. It can be observed from FIG. 8B that the 2$^{nd}$-bit effect can be mitigated when the thickness of the low doping concentration region ranges from about 50 Å to about 500 Å. Besides, according to the simulation results, when the thickness of the low doping concentration region is greater than 150 Å, the 2$^{nd}$-bit effect can be mitigated to a limited degree; accordingly, the thickness of the low doping concentration region preferably ranges from about 50 Å to about 150 Å.

Simulation Experiment 6

Figure 9:
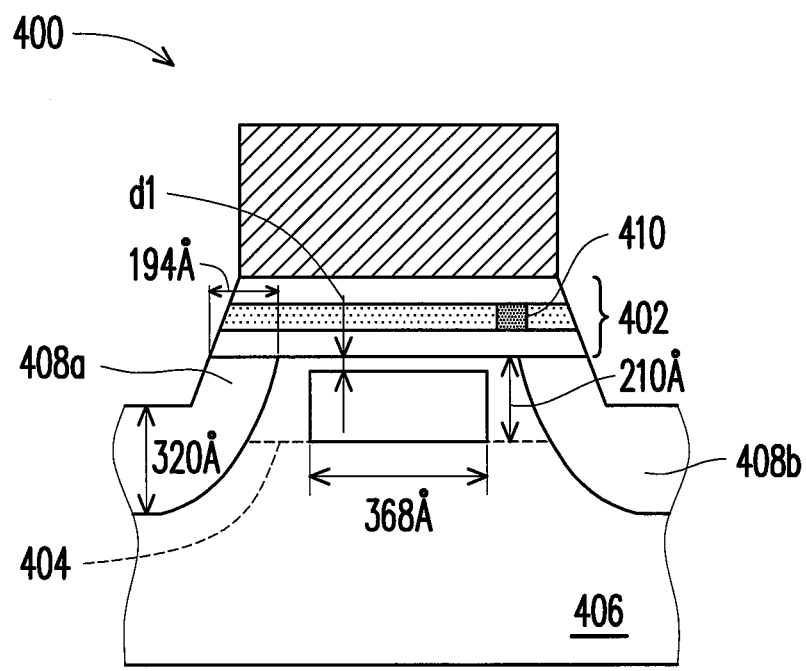
FIG. 9 is a schematic view illustrating an ROM according to a simulation experiment 6.

The simulation object is basically the same as the ROM depicted in FIG. 9, and the fixed parameters are:

$L_g=0.08$ μm; $L_{eff}=0.057$ μm; a doping concentration of the low doping concentration region is 1e17 cm$^{-3}$; doping concentrations of the high doping concentration region and the substrate are 2e18 cm$^{-3}$; doping concentrations of the source region and the drain region=1e20 cm$^{-3}$; a width of a charge storage region 410 is 50 Å; the right edge of the charge storage region 410 is aligned with the left edge of the drain region 408b.

Figure 10:
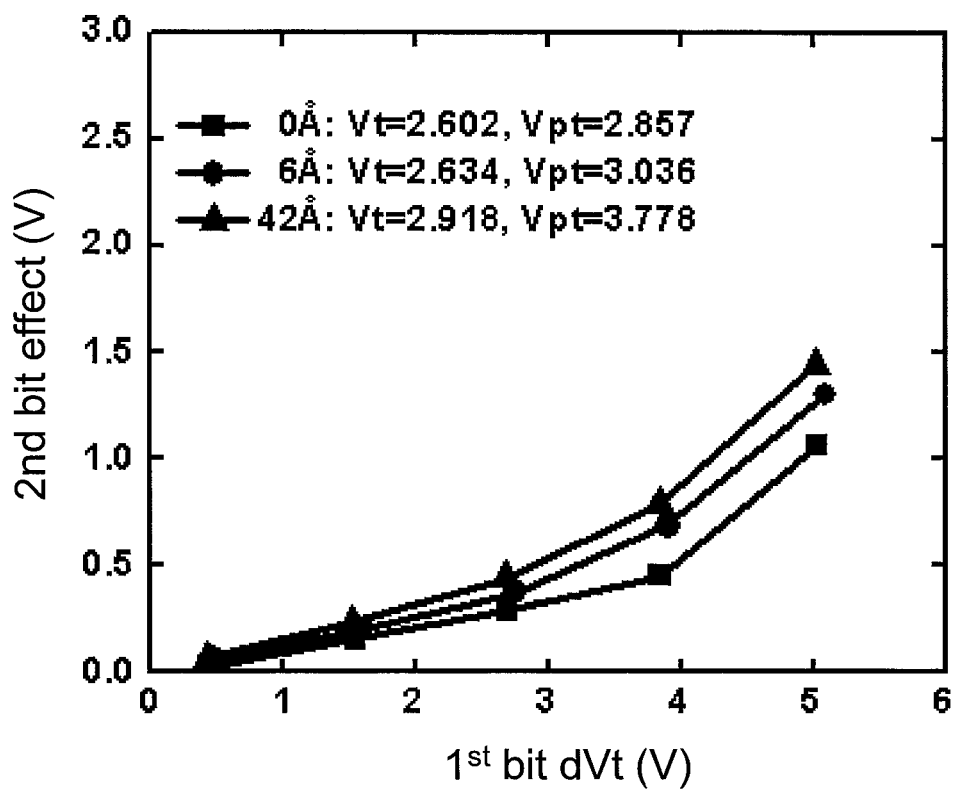
FIG. 10 shows changes to a $2^{nd}$-bit effect according to the simulation experiment 6.

The variable is a distance d1 between the low doping concentration region and the ONO layer. The distance d1 varies from about 0 Å to about 42 Å, and the simulation results are shown in FIG. 10. It can be learned from FIG. 10 that the effect can be achieved when the low doping concentration region is in direct contact with the ONO layer (i.e., the charge storage structure).

Simulation Experiment 7

Figure 11:
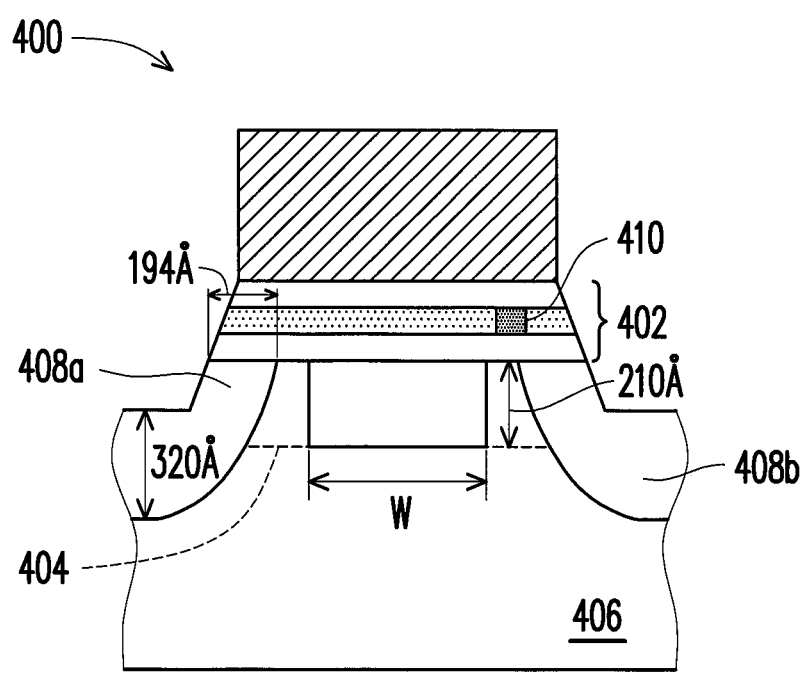
FIG. 11 is a schematic view illustrating an ROM according to a simulation experiment 7.

The simulation object is basically the same as the ROM depicted in FIG. 11, and the fixed parameters are:
$L_g$=0.08 μm; $L_{eff}$=0.057 μm; a doping concentration of the low doping concentration region is 1e17 $cm^{-3}$; doping concentrations of the high doping concentration region and the substrate are 2e18 $cm^{-3}$; doping concentrations of the source region and the drain region=1e20 $cm^{-3}$.

Figure 12A:
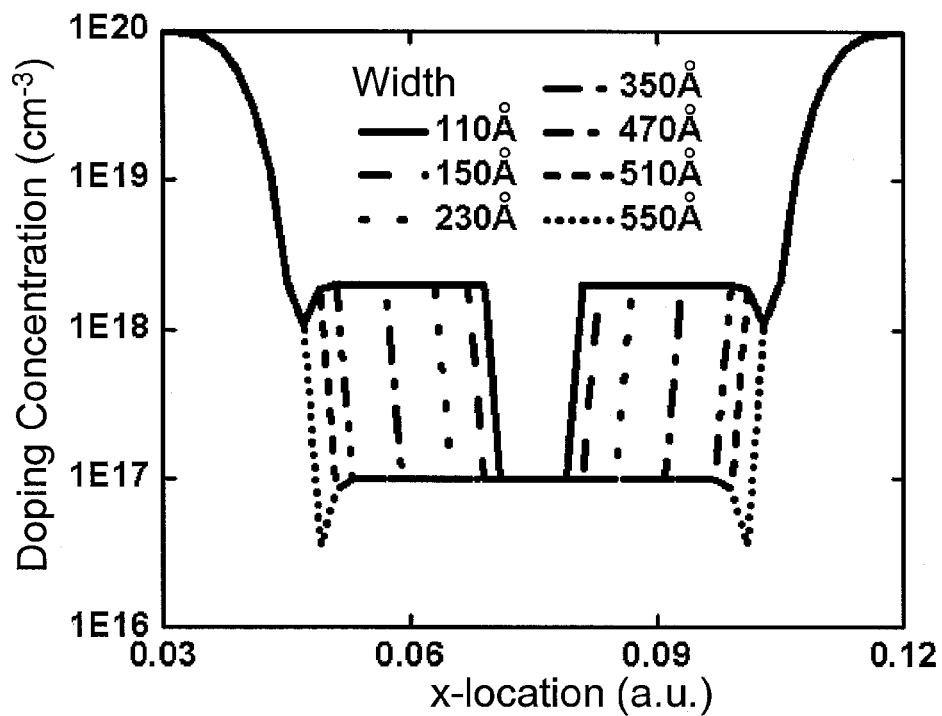
FIG. 12A illustrates variations in a distance between an edge of a charge storage region and an edge of a low doping concentration region according to the simulation experiment 7.
Figure 12B:
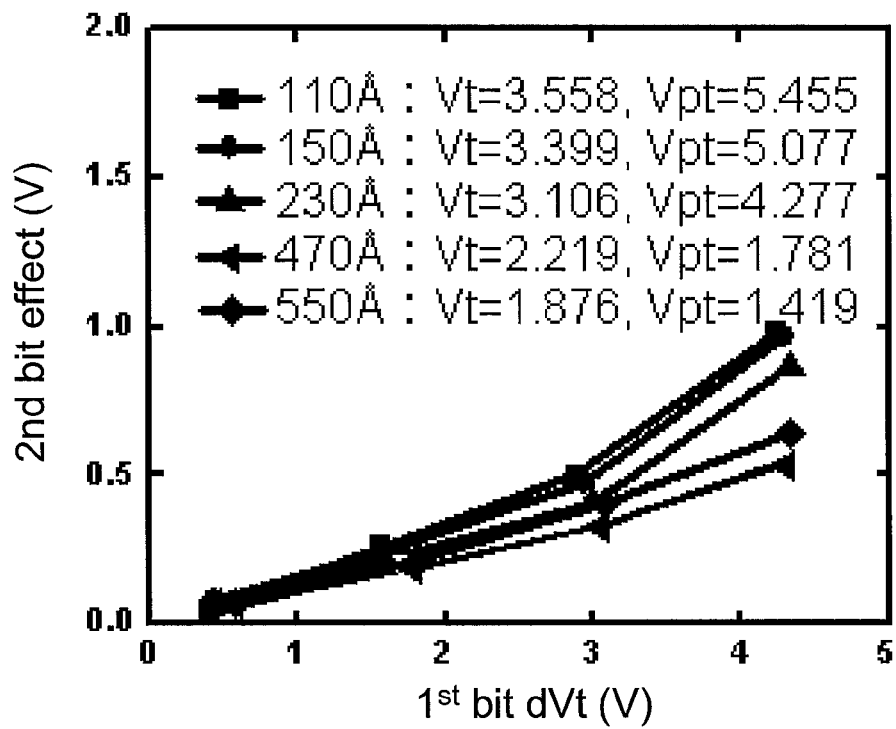
FIG. 12B shows changes to a $2^{nd}$-bit effect according to the simulation experiment 7.

The variable is a distance between the edge of the low doping concentration region and the source region 408a or the drain region 408b. As shown in FIG. 12A, a width W varies from about 110 Å to about 550 Å, and the simulation results are shown in FIG. 12B.

When $L_g$ is 0.08 μm, and the distance between the edge of the charge storage region and the edge of the low doping concentration region is 0, the corresponding width W is 470 Å. Hence, it can be learned from FIG. 12B that the $2^{nd}$-bit effect can be better reduced if the distance between the edge of the low doping concentration region and the source region 408a or the drain region 408b is shorter than 150 Å, and that the optimal effect can be accomplished if the edge of the charge storage region is aligned to the edge of the low doping concentration region.

Simulation Experiment 8

The simulation object is basically the same as the ROM described in the simulation experiment 7, while the difference lies in that $L_g$=0.07 μm and $L_{eff}$=0.043 μm in this simulation experiment.

Figure 13A:
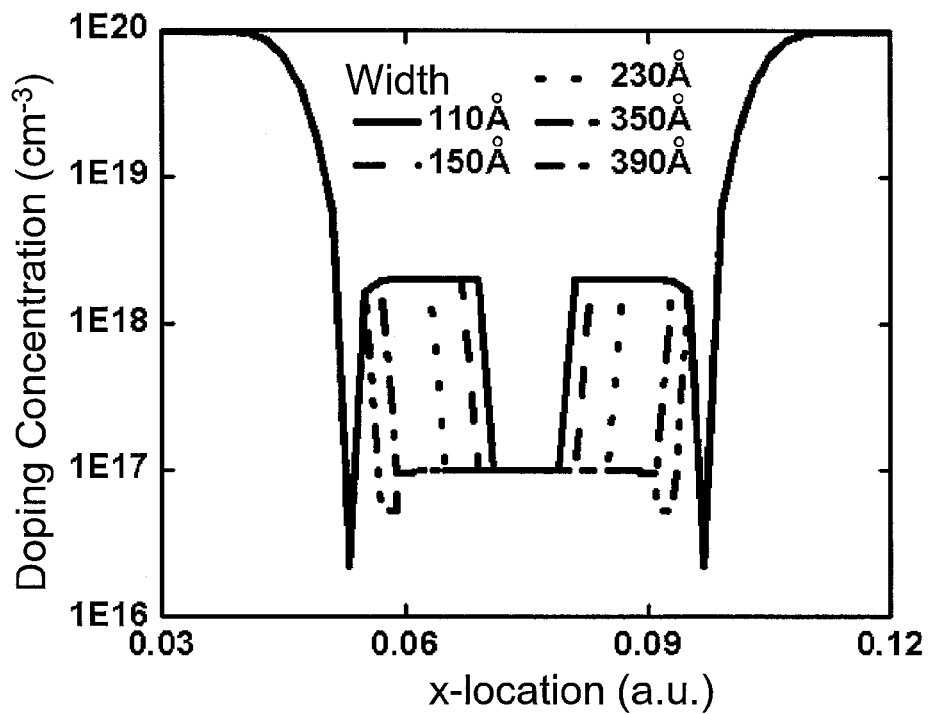
FIG. 13A illustrates variations in a distance between an edge of a charge storage region and an edge of a low doping concentration region according to a simulation experiment 8.
Figure 13B:
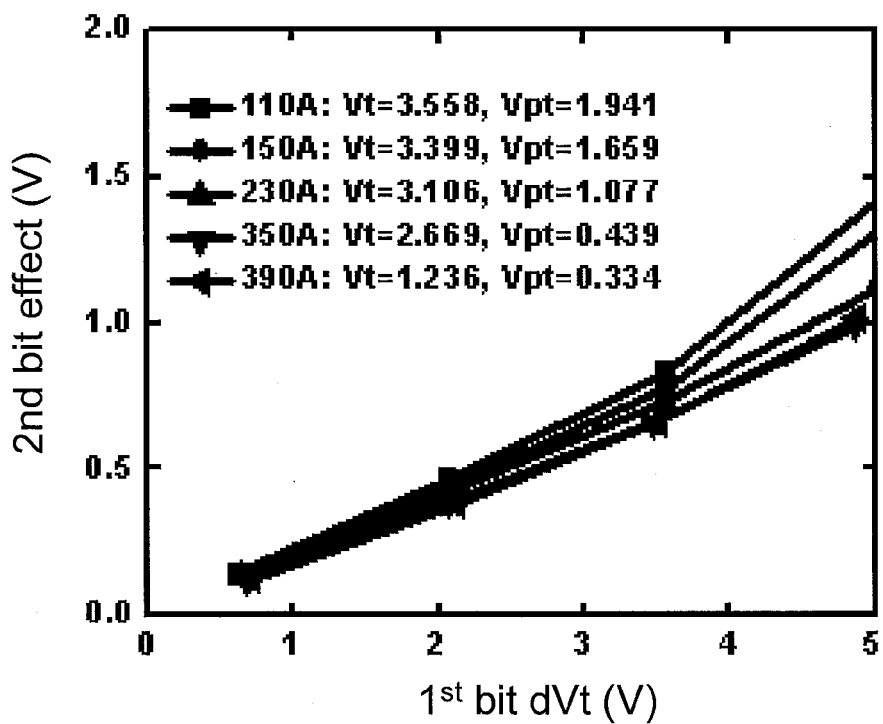
FIG. 13B shows changes to a $2^{nd}$-bit effect according to the simulation experiment 8.

Similarly, the variable is the distance between the edge of the low doping concentration region and the source region 408a or the drain region 408b. As shown in FIG. 13A, the width W varies from about 110 Å to about 390 Å, and the simulation results are shown in FIG. 13B.

When $L_g$ is 0.07 μm, and the distance between the edge of the charge storage region and the edge of the low doping concentration region is 0, the corresponding width W is 350 Å. Hence, it can be learned from FIG. 13B that the $2^{nd}$-bit effect can be better reduced if the distance between the edge of the low doping concentration region and the source region 408a or the drain region 408b is shorter than 150 Å, and that the optimal effect can be accomplished if the edge of the charge storage region is aligned to the edge of the low doping concentration region. The simulation results are the same as those of the simulation experiment 7.

Simulation Experiment 9

Figure 14A:
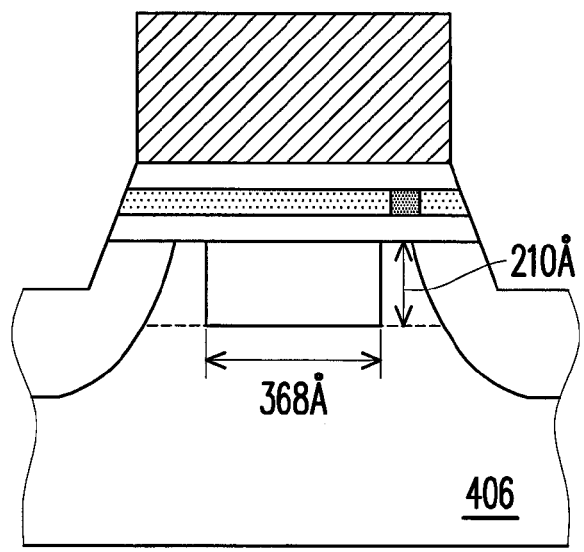
FIG. 14A to FIG. 14C are schematic views illustrating an ROM according to a simulation experiment 9.
Figure 14B:
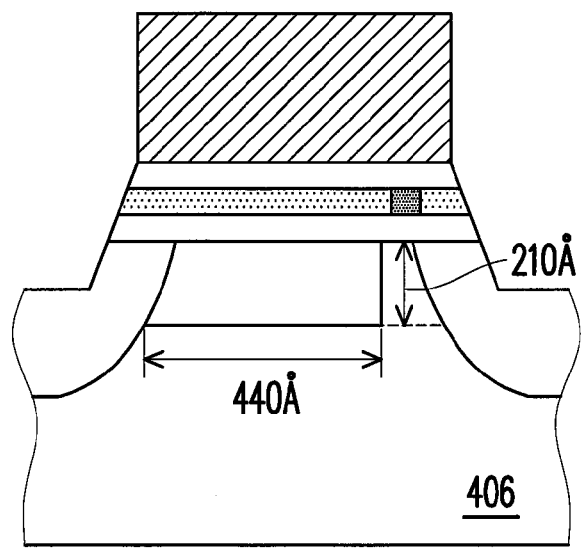
Figure 14C:
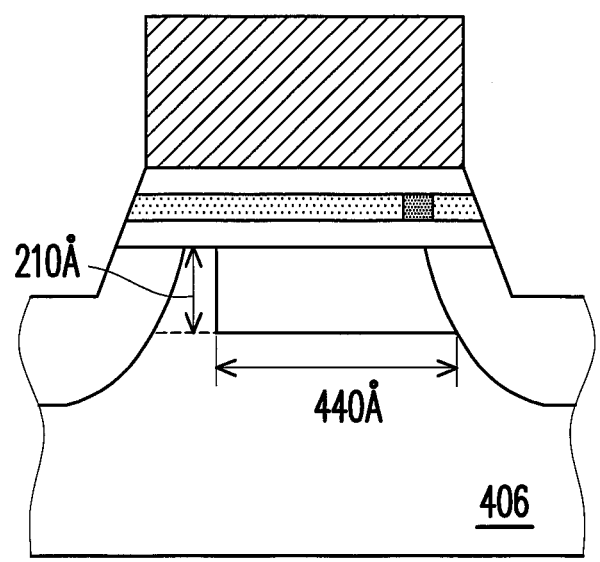

The simulation object is basically the same as the ROM depicted in FIG. 14A to FIG. 14C, and the fixed parameters are:
$L_g$=0.08 μm; $L_{eff}$=0.057 μm; a doping concentration of the low doping concentration region is 1e17 $cm^{-3}$; doping concentrations of the high doping concentration region and the substrate are 2e18 $cm^{-3}$; doping concentrations of the source region and the drain region=1e20 $cm^{-3}$; a width of a charge storage region 410 is 50 Å; the right edge of the charge storage region 410 is aligned with the left edge of the drain region 408b.

The variable is the relationship between the charge storage region and the high doping concentration region and the low doping concentration region in the local extreme doping region. In FIG. 14A, the high doping concentration regions are symmetrically configured at two sides of the low doping concentration region. In FIG. 14B, one high doping concentration region is asymmetrically configured at one side of the low doping concentration region, and the high doping concentration region and the charge storage region are at the same side. In FIG. 14C, one high doping concentration region is asymmetrically configured at one side of the low doping concentration region, but the high doping concentration region and the charge storage region are at different sides. The simulation results are shown in FIG. 15.

Figure 15:
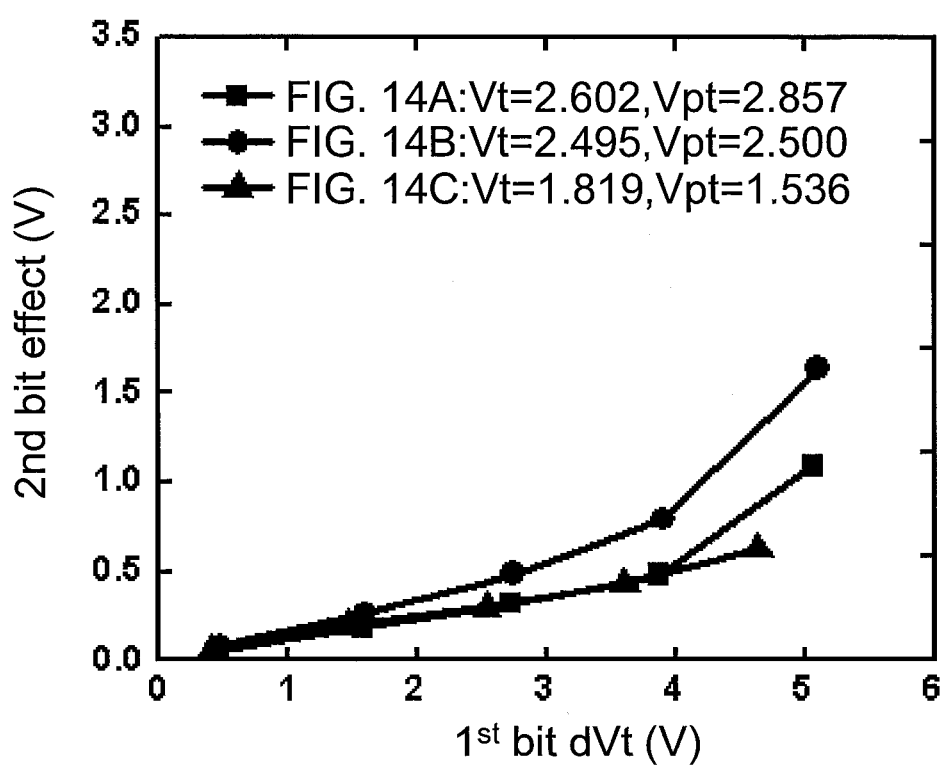
FIG. 15 shows changes to a $2^{nd}$-bit effect according to the simulation experiment 9.

It can be observed from FIG. 15 that the $2^{nd}$-bit effect can be mitigated to a better extent when the structure shown in FIG. 14C is applied.

The ROM in the simulation experiments 2 to 9 is schematically shown in FIG. 4, if not otherwise specified.

FIG. 16A to FIG. 16D are schematic cross-sectional views illustrating a manufacturing process of an ROM according to a second embodiment of the disclosure.

Figure 16A:
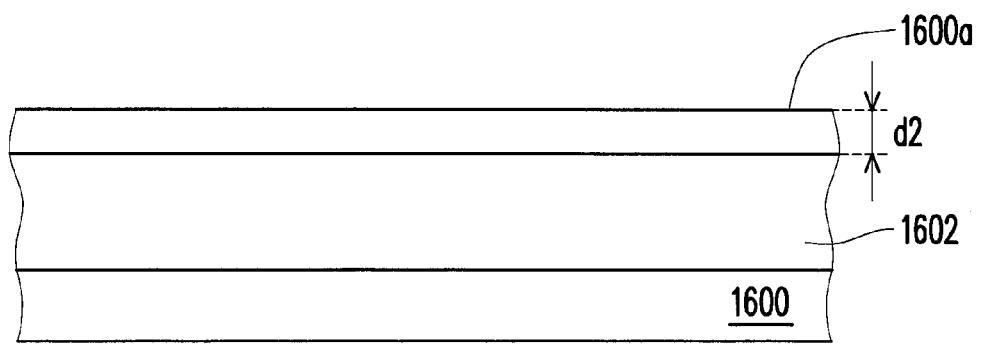
FIG. 16A to FIG. 16D are schematic cross-sectional views illustrating a manufacturing process of an ROM according to a second embodiment of the disclosure.

With reference to FIG. 16A, a well region 1602 spaced from a surface 1600a of a substrate 1600 by a distance d2 is formed in the substrate 1600, and a doping concentration of the well region 1602 is ten times or more than ten times a doping concentration of the substrate 1600.

In the manufacturing process, the dopants are directly implanted into the substrate 1600, such that the dopant is located in the substrate 1600 beyond the distance d2 followed by heat treatment. According to other embodiments, a method of forming the well region 1602 may include performing a counterdoping process on the substrate 1600 after a doping process is performed on the substrate 1600, so as to reduce a doping concentration in the substrate 1600 within the distance d2. That is to say, a p-type ion implantation process can be performed on the substrate 1600, and then an n-type ion implantation process can be performed on the substrate 1600 within the distance d2.

Figure 16B:
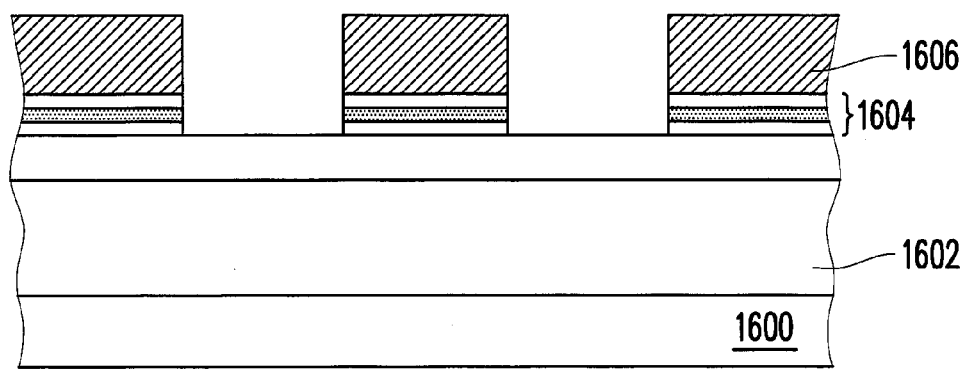

With reference to FIG. 16B, charge storage structures 1604 are formed on the substrate 1600, and gate 1606 are formed on the charge storage structures 1604 respectively. Each of the charge storage structures 1604 is an ONO layer, for instance, and each of the gate 1606 is a polysilicon layer, for instance.

Figure 16C:
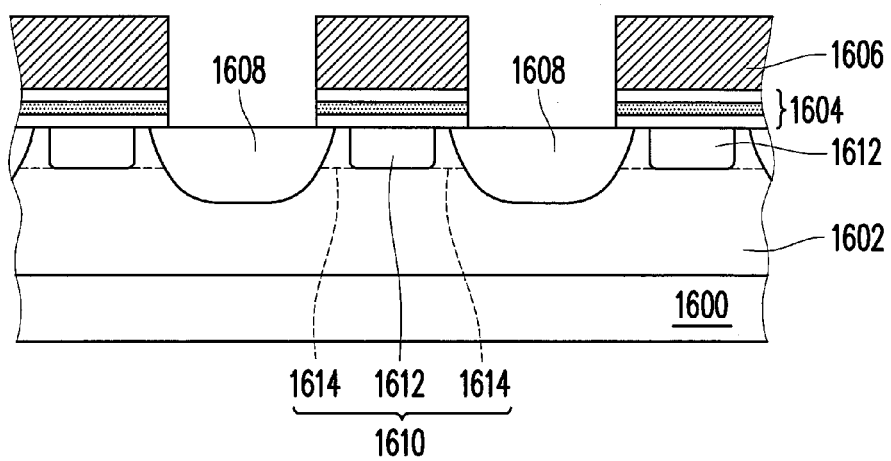

With reference to FIG. 16C, source region/drain region 1608 may be formed in the substrate 1600 between two of the charge storage structures 1604. Local extreme doping regions 1610 are formed in the substrate 1600 between the source region/drain region 1608. Each of the local extreme doping region 1610 at least includes a low doping concentration region 1612 and at least one high doping concentration region 1614, and a doping concentration of the high doping concentration region 1614 is three times or more than three times a doping concentration of the low doping concentration region 1612. The high doping concentration region 1614 is formed by performing a pocket implantation process on an edge of the source region/drain region 1608, so as to form the high doping concentration region 1614 with a narrow top portion and a wide bottom portion. The pocket implantation process is, for instance, a carbon co-implantation process or a low temperature ion implantation process with thermal reduction. Thereby, the required doping profile of the high doping concentration region 1614 can be accurately generated. At this time, the doping concentration of the well region 1602 is three times to ten times the doping concentration of the low doping concentration region 1612, for instance.

Figure 16D:
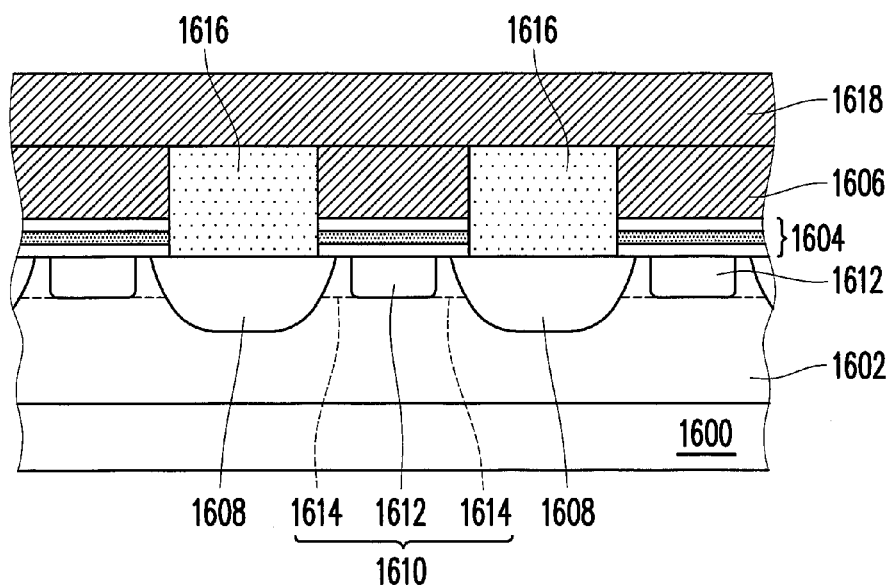

Thereafter, the process shown in FIG. 16D can be selectively performed, i.e., an insulation layer 1616 is formed on a surface of the source region/drain region 1608, and a word line 1618 connected to the gate 1606 is formed on the entire substrate 1600.

In light of the foregoing, the local extreme doping region is constituted by a plurality of doping regions whose doping concentrations significantly differ from one another, and the local extreme doping region is configured in the channel region of the ROM. Thereby, the $2^{nd}$-bit effect on the device operation can be mitigated.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A read only memory comprising:
  a substrate;
  a source region and a drain region, disposed in the substrate;
  a charge storage structure, located on the substrate between the source region and the drain region;
  a gate, configured on the charge storage structure; and
  a local extreme doping region, located in the substrate between the source region and the drain region, the local extreme doping region comprising:
  a low doping concentration region; and
  at least one high doping concentration region, disposed between the low doping concentration region and one of the source region and the drain region, wherein
  a doping concentration of the at least one high doping concentration region is three times or more than three times a doping concentration of the low doping concentration region,
  wherein the low doping concentration region is located in the substrate no deeper than the source region and the drain region and at a center region of the local extreme doping region, and the least one high doping concentration region is located from the top surface to the depth of the substrate at an edge region of the local extreme doping region.

2. The read only memory as recited in claim 1, wherein a conductive type of the at least one high doping concentration region is the same as a conductive type of the low doping concentration region.

3. The read only memory as recited in claim 1, wherein the doping concentration of the at least one high doping concentration region is from three times to twenty times the doping concentration of the low doping concentration region.

4. The read only memory as recited in claim 3, wherein the doping concentration of the at least one high doping concentration region is from three times to ten times the doping concentration of the low doping concentration region.

5. The read only memory as recited in claim 1, wherein a doping concentration of the substrate is three times to ten times the doping concentration of the low doping concentration region.

6. The read only memory as recited in claim 1, wherein a doping concentration of the substrate is equal to or approximate to the doping concentration of the at least one high doping concentration region.

7. The read only memory as recited in claim 1, wherein the at least one high doping concentration region comprises two doping regions respectively located between the source region and the low doping concentration region and between the drain region and the low doping concentration region.

8. The read only memory as recited in claim 7, wherein the two doping regions are symmetrically configured at two sides of the low doping concentration region.

9. The read only memory as recited in claim 1, wherein a thickness of the low doping concentration region ranges from about 50Å to about 500Å.

10. The read only memory as recited in claim 9, wherein a thickness of the low doping concentration region ranges from about 50Å to about 150Å.

11. The read only memory as recited in claim 1, wherein the low doping concentration region is in direct contact with the charge storage structure.

12. The read only memory as recited in claim 1, wherein the charge storage structure comprises an ONO layer.

13. The read only memory as recited in claim 1, wherein the at least one high doping concentration region has a narrow top portion and a wide bottom portion.

14. The read only memory as recited in claim 1, wherein the charge storage structure has at least one charge storage region, and an edge of the at least one charge storage region is aligned with the edge of the drain region.

15. The read only memory as recited in claim 1, wherein a distance between an edge of the low doping concentration region and the source region is smaller than 150Å.

16. The read only memory as recited in claim 1, wherein a distance between an edge of the low doping concentration region and the drain region is smaller than 150Å.

17. The read only memory as recited in claim 1, wherein the charge storage structure has at least one charge storage region, and the at least one high doping concentration region is one doping region.

18. The read only memory as recited in claim 17, wherein the one doping region is asymmetrically configured at one side of the low doping concentration region, and the one doping region and the charge storage region are at different sides.

* * * * *